(12) United States Patent
Ito et al.

(10) Patent No.: US 7,045,458 B2
(45) Date of Patent: May 16, 2006

(54) SEMICONDUCTOR AND METHOD OF MANUFACTURING THE SAME

(75) Inventors: Takayuki Ito, Kawasaki (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 10/924,909

(22) Filed: Aug. 25, 2004

(65) Prior Publication Data

US 2005/0062107 A1    Mar. 24, 2005

(30) Foreign Application Priority Data

Aug. 26, 2003    (JP)    ............................. 2003-208809

(51) Int. Cl.
*H01L 21/44*    (2006.01)

(52) U.S. Cl. .................. 438/662; 438/663; 438/535

(58) Field of Classification Search ............... 438/662, 438/663, 535, 487, 488, 489, 712, 501, 502, 438/509, 510, 505, 506, 520, 522, 514, 933, 438/752, 753

See application file for complete search history.

(56) References Cited

U.S. PATENT DOCUMENTS 6,528,397 B1 *    3/2003    Taketomi et al. ........... 438/487
6,806,498 B1 *    10/2004    Taketomi et al. ............. 257/64

FOREIGN PATENT DOCUMENTS

JP    11-87729    3/1999
JP    2002-198322    7/2002

* cited by examiner

*Primary Examiner*—David Nhu
(74) *Attorney, Agent, or Firm*—Finnegan, Henderson, Farabow, Garrett & Dunner, L.L.P.

(57)    ABSTRACT

A semiconductor comprises a substrate including a single crystal semiconductor region, and a pattern including a line pattern provided on the substrate, the line pattern having a longitudinal direction differing from a crystal orientation of the single crystal semiconductor region.

18 Claims, 9 Drawing Sheets

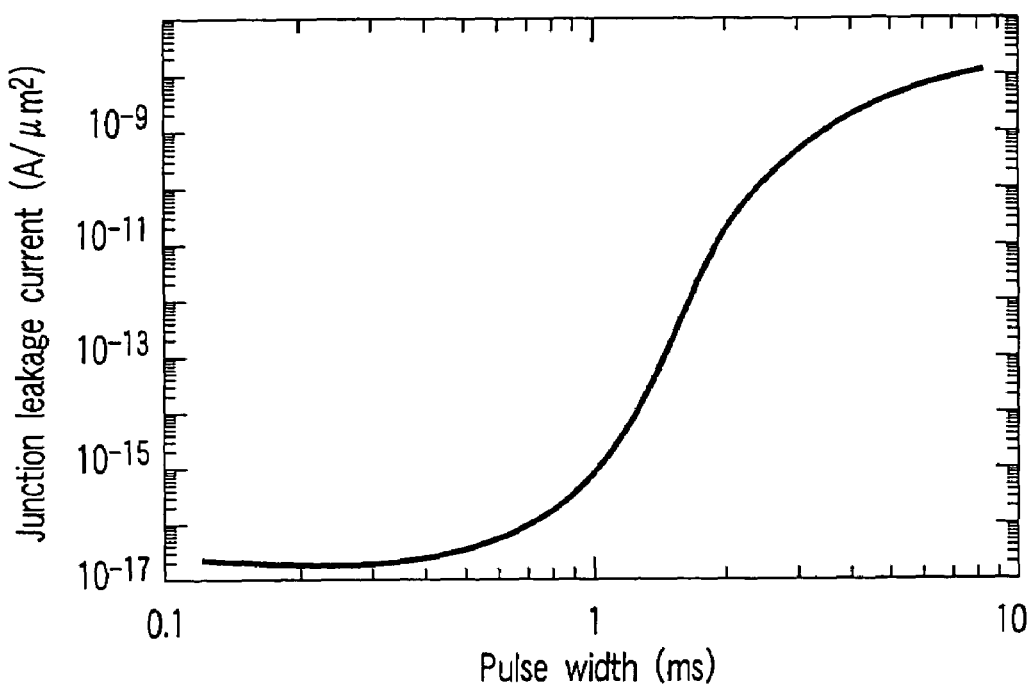
F I G. 22
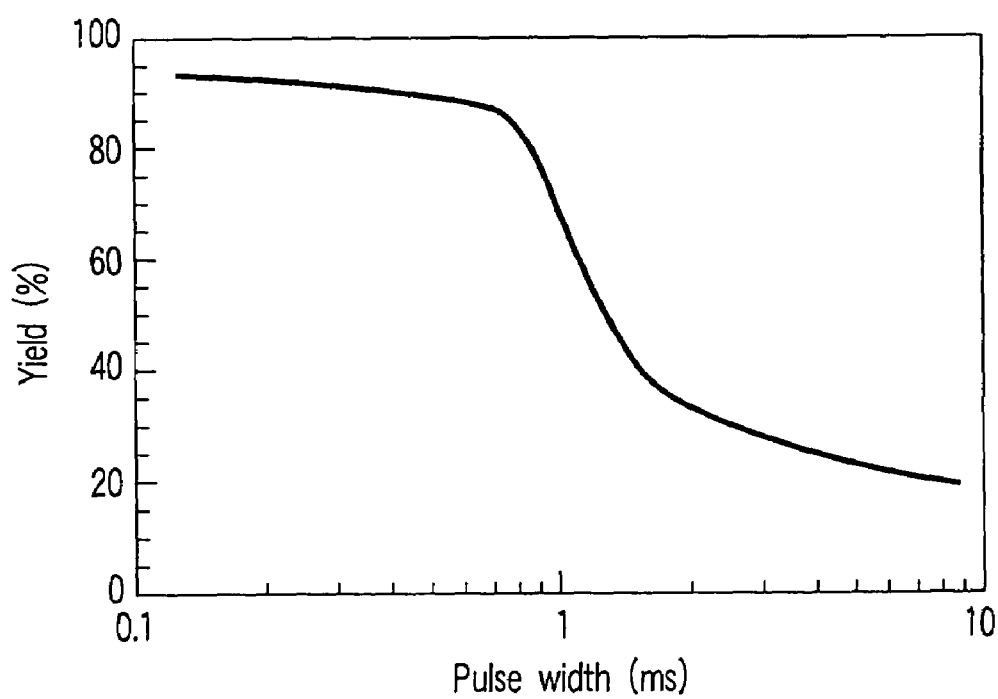
F I G. 23

US 7,045,458 B2

SEMICONDUCTOR AND METHOD OF MANUFACTURING THE SAME

CROSS-REFERENCE TO RELATED APPLICATIONS

This application is based upon and claims the benefit of priority from prior Japanese Patent Application No. 2003-208809, filed Aug. 26, 2003, the entire contents of which are incorporated herein by reference.

BACKGROUND OF THE INVENTION

1. Field of the Invention

This invention relates to a semiconductor device and a method of manufacturing the semiconductor device, and more particularly to a semiconductor device capable of alleviating damage to the inside of the substrate caused by optical heating and a method of manufacturing the semiconductor device.

2. Description of the Related Art

The performance of LSI has been increased by increasing the degree of integration, or by miniaturizing the elements constructing LSI. As the element size is made smaller, the parasitic resistance and the short channel effect become greater. Therefore, the formation of a low resistance, shallow pn junction is becoming more important.

A shallow impurity diffusion region can be formed by implanting ions at low acceleration energy and optimizing subsequent annealing. To decrease the resistance of the impurity diffusion region, it is necessary to perform an anneal at high temperature to activate impurity ions.

Boron (B) ions, phosphorus (P) ions, or arsenic (As) ions are used as impurity ions for ion implantation. These impurity ions have a large diffusion coefficient in silicon (Si). Therefore, in RTA (Rapid Thermal Anneal) using a halogen lamp, an inward diffusion and outward diffusion of impurity ions take place, which makes the formation of shallow impurity diffusion regions difficult gradually.

The inward diffusion and outward diffusion can be suppressed by lowering the anneal temperature. However, if the anneal temperature is lowered, the activation rate of the impurity ions decreases significantly. Therefore, even if the approach of lowering the anneal temperature, it is difficult to form a shallow impurity diffusion region.

As described above, it is difficult to form a low resistance, shallow (20 nm or less) impurity diffusion region by the RTA process using a conventional halogen lamp.

To overcome this problem, a flash lamp annealing method using a flash lamp into which noble gas, such as xenon (Xe), is sealed has recently been examined as means for supplying instantaneously the energy necessary to activate impurity ions.

The ½ pulse width of a flash lamp is about 10 milliseconds. Therefore, when the flash lamp annealing method is used, the time during which the wafer surface is kept at high temperature is very short, with the result that the impurity ions implanted into the wafer surface hardly diffuse. Accordingly, it is possible to activate the impurity ions with almost no change in the distribution of the impurity ions implanted in the wafer surface.

However, the conventional flash lamp annealing method has the following problem.

To achieve a sufficient annealing effect, power intensity as high as 20 J/cm$^2$ or more is required. In addition, the temperature at the wafer surface rises abruptly. As a result, a temperature difference develops between the right side and reverse side of the wafer, leading to an increase in the thermal stress inside the wafer. Such an increase in the thermal stress causes damage (heat damage), such as slips or cracks (breaks), in the wafer. Such heat damage to the wafer leads to a decrease in the production yield.

The heat damage to the wafer can be avoided by lowering the temperature at which the wafer is preheated or the irradiation energy density of the flash lamp before turning on the flash lamp. In that case, however, a sufficient activation of impurity ions cannot be expected.

BRIEF SUMMARY OF THE INVENTION

A semiconductor device according to an aspect of the present invention comprises a substrate including a single crystal semiconductor region; and a pattern including a line pattern provided on the substrate, the line pattern having a longitudinal direction differing from a crystal orientation of the single crystal semiconductor region.

A method of manufacturing a semiconductor device according to an aspect of the present invention comprises positioning a light source above a substrate including a single crystal semiconductor region; and heating the substrate by use of light emitted from a light source and forming a light intensity distribution on the substrate by use of the light, the light intensity distribution including a distribution whose intensity has the maximum value in a direction different from a crystal orientation of the single crystal semiconductor region.

A method of manufacturing a semiconductor device according to another aspect of the present invention comprises positioning a light source above a substrate including a single crystal semiconductor region; and heating the substrate by use of light emitted from a light source, and a ½ pulse width of the light source being set in 1 millisecond or less.

BRIEF DESCRIPTION OF THE SEVERAL VIEWS OF THE DRAWING

FIG. 22 is a diagram showing the relationship between junction leakage current of a pn junction comprising the impurity diffusion region of the seventh embodiment and pulse width; and FIG. 23 is a diagram showing the relationship between yield of a device comprising the impurity diffusion region of the seventh embodiment and the pulse width.

DETAILED DESCRIPTION OF THE INVENTION

Hereinafter, referring to the accompanying drawings, embodiments of the present invention will be explained.

FIRST EMBODIMENT

Figure 1A:
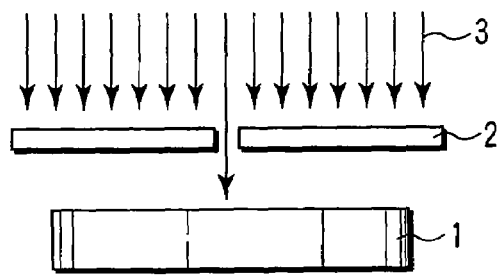
FIGS. 1A to 1C are sectional views showing the steps of a manufacturing method of a semiconductor device according to the first embodiment of the present invention.
Figure 1B:
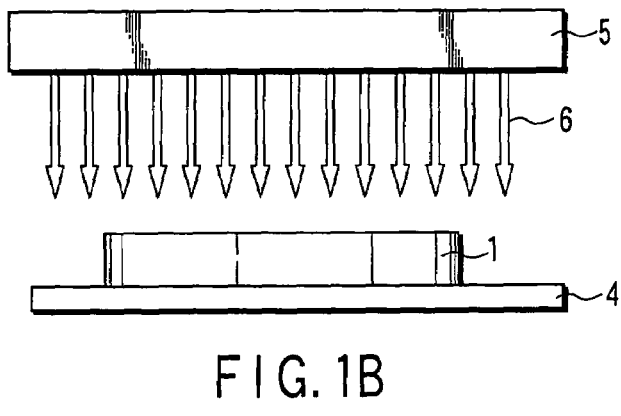
Figure 1C:
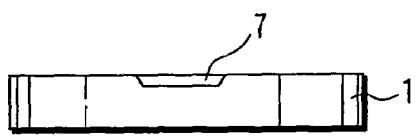

FIGS. 1A to 1C are sectional views showing the steps of a manufacturing method of a semiconductor device according to the first embodiment of the present invention.

First, as shown in FIG. 1A, a mask 2 for ion implantation is positioned above a single crystal Si wafer (Si substrate) 1 and then impurity ions 3 are implanted into the Si wafer from above the mask with a known ion implanter (not shown).

The Si wafer 1 may be an ordinary bulk Si wafer or SOI wafer. In addition, a wafer (substrate) mainly made of a semiconductor material other than silicon, such as silicon germanium may be used as the Si wafer 1. The mask 2 may be an ordinary mask or a stencil mask. As for the impurity ions 3, for example, boron (B) ions are used as p-type impurity ions and phosphorus (P) ions, or arsenic (As) ions are used as n-type impurity ions.

Next, as shown in FIG. 1B, the Si wafer 1 is placed on a hot plate 4. With the Si wafer 1 being heated from its reverse side (preheated), the Si wafer 1 is heated from its right side by light emitted from a flash lamp light source 5 (by flash lamp annealing).

By the heating process, the impurity ions 3 are activated, with the result that an impurity diffusion region 7 of 20 nm or less in thickness is formed on the surface of the Si wafer 1 as shown in FIG. 1C.

The heating temperature (substrate preheating temperature) of the Si wafer 1 with the hot plate 4 is set to, for example, 400° C. The heating temperature is not limited to 400° C. and may be any temperature in the range of 300° C. to 600° C. In the temperature range, an impurity diffusion region 7 with the desired concentration profile can be formed easily. The substrate preheating temperature is generally set lower than the heating temperature of the Si wafer with the flash lamp light source 5.

Although the hot plate 4 (resistance heating device) has been used to heat (preheat) the Si wafer from its reverse side, heating device (optical heating means), such as a halogen lamp, one of the infrared lamps, may be used.

The flash lamp light source 5 includes a plurality of flash lamps into which noble gas, such as Xe gas, is sealed. The energy of the light 6 emitted from the flash lamp light source 5 is at, for example, 35 J/cm². The energy of the light 6 is not restricted to 35 J/cm² and may be any value equal to 60 J/cm² or less.

Figure 2:
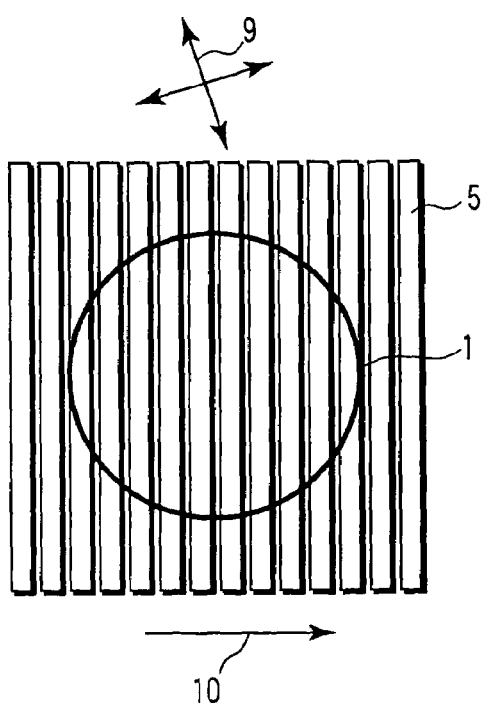
FIG. 2 is a plan view showing the relationship between a plurality of flash lamps and the crystal orientation of a Si wafer in the heating process of the first embodiment.

FIG. 2 is a plan view showing the relationship between a plurality of lamps 8 constracting the flash lamp light source 5 and the crystal orientation of the Si wafer 1 in the heating process. The crystal surface of the Si wafer is, for example, (100) and the crystal orientation 9 is the surface orientation of the cleavage plane of the Si wafer 1, for example, <011>.

As seen from FIG. 2, in the first embodiment, the positional relationship between the flash lamp light source 5 and the Si wafer 1 is so set that the arranging direction (lamp arranging direction) 10 of the flash lamps 8 differs from the crystal orientation 9. While in the embodiment, the longitudinal direction of the flash lamps 8 is also set so as to differ from the crystal orientation 9, this is not always necessary.

Figure 3:
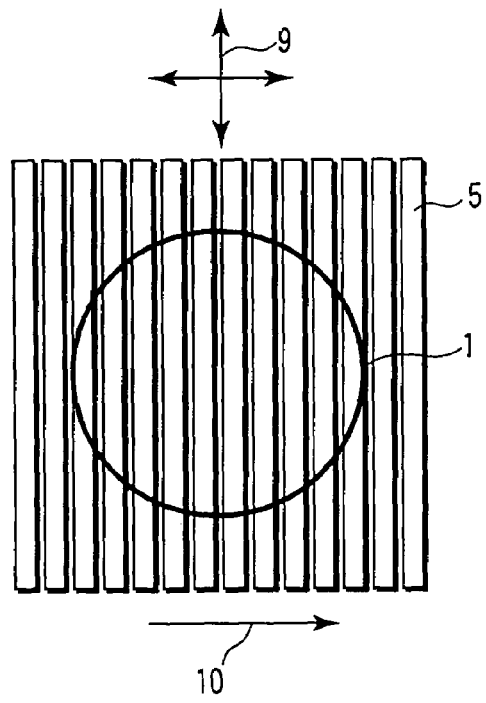
FIG. 3 is a plan view showing the relationship between a plurality of flash lamps and the crystal orientation of a Si wafer in a conventional heating process.

On the other hand, in a conventional flash lamp annealing method (comparative example), as shown in FIG. 3, the positional relationship between the flash lamp light source 5 and the Si wafer 1 is so set that the lamp arranging direction 10 (the longitudinal direction of the flash lamp 8) is in parallel with the crystal orientation 9.

Figure 4:
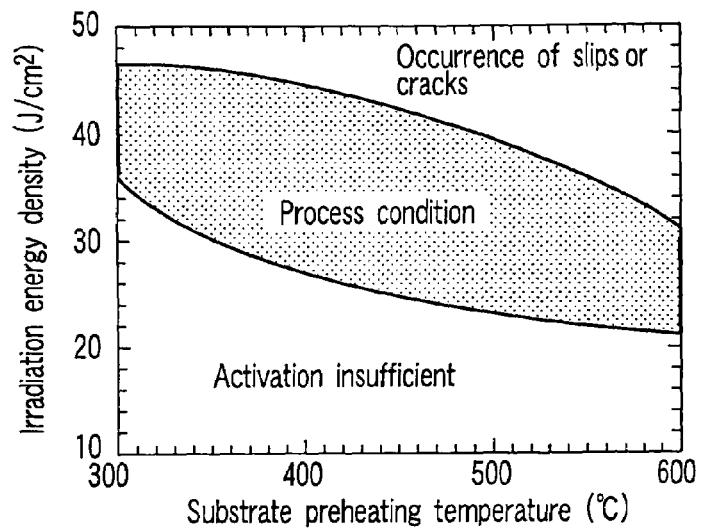
FIG. 4 is a diagram of a process window of the first embodiment regarding the substrate preheating temperature and the irradiation energy density.
Figure 5:
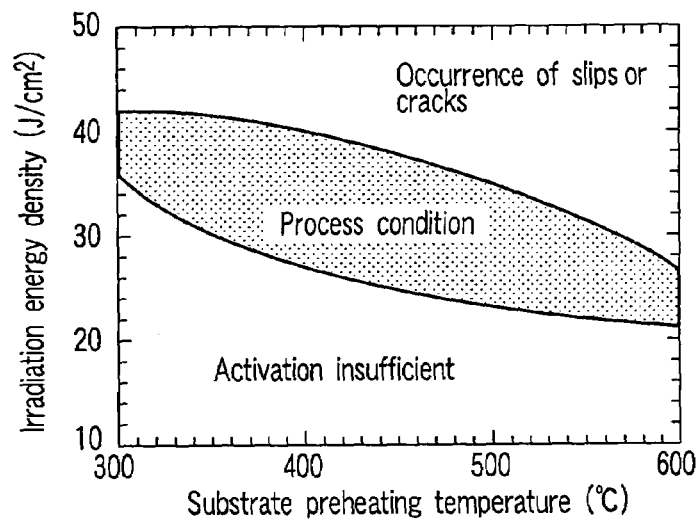
FIG. 5 is a diagram of a process window of a comparative example regarding the substrate preheating temperature and the irradiation energy density.

FIG. 4 shows a process window of the first embodiment regarding the heating temperature (substrate preheating temperature) of the Si wafer 1 with the hot plate 1 and the irradiation energy density on the Si wafer 1 with the flash lamp light source 5. FIG. 5 shows a process window of a comparative example regarding the substrate-preheating temperature and the irradiation energy density.

As the substrate preheating temperature becomes higher, the irradiation energy density needed to activate impurities becomes lower, but at the same time, the irradiation energy density at which heat damage (slips, cracks) occurring in the Si wafer 1 also becomes lower.

When the irradiation energy density at which heat damage to the Si wafer 1 is caused in the first embodiment is compared with that in the comparative example, it is seen from FIGS. 4 and 5 that the density in the first embodiment is higher at any substrate preheating temperature. That is, it is found that the first embodiment has a winder process window than the comparative example.

Generally, in lamp heating, the light intensity tends to be higher just under the lamp and be lower between the lamps. Therefore, a temperature difference occurs between the place just under the lamp and the place between the lamps. Such a temperature difference causes thermal stress to take place in the Si wafer 1.

In the comparative example, the thermal stress is considered to occur along the crystal orientation where the substrate strength is low. This is why heat damage is liable to occur in the Si wafer 1 in the comparative example.

On the other hand, with the positional relationship between the Si wafer 1 and the flash lamp light source 5 in the first embodiment, the light intensity distribution formed by the light 6 on the Si wafer 1 is so formed that the intensity becomes the highest in a direction different from the crystal orientation of the Si wafer 1.

As a result, the direction in which thermal stress develops differs from the crystal orientation of the Si wafer 1. Therefore, in the first embodiment, the substrate strength can be secured, with the result the resistance of the Si wafer to heat damage, such as slips or cracks, can be considered to increase.

As described above, with the first embodiment, when flash lamp annealing is done, the Si wafer 1 and the flash lamp light source 5 are set in a specific positional relationship, which makes it easy to prevent heat damage from occurring in the Si. That is, it is possible to form a shallow impurity diffusion region 7 easily without permitting heat damage to occur in the Si wafer 1.

SECOND EMBODIMENT

Figure 6A:
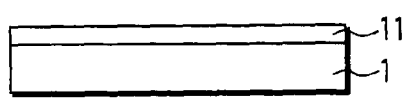
FIGS. 6A to 6C are sectional views showing the steps of a manufacturing method of a semiconductor device according to the second embodiment of the present invention.
Figure 6B:
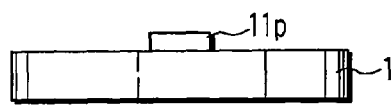
Figure 6C:
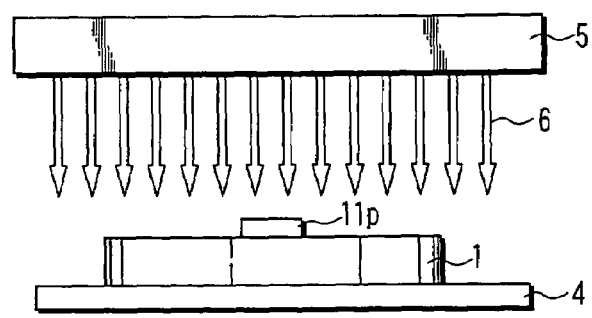

FIGS. 6A to 6C are sectional views showing the steps of a manufacturing method of a semiconductor device according to the second embodiment of the present invention. In FIGS. 6A to 6C, like parts as in the above drawings are indicated by corresponding reference numerals and a detailed explanation of them will be omitted (the same is true for a third and later embodiments).

First, as shown in FIG. 6A, a film to be processed 11 serving as a pattern is formed on the Si wafer 1. The film 11 is, for example, an insulating film, such as a silicon oxide film, a semiconductor film, such as a polysilicon film, a metal film, such as an aluminum film, or a resist, such as a photoresist.

Next, as shown in FIG. 6B, the film 11 is processed by known photolithography and etching, thereby forming a pattern 1ip including a plurality of line patterns.

At this time, the pattern 1ip is so formed that the arranging direction of the line patterns (line pattern arranging direction) differs from the crystal orientation 9. The pattern 1ip is, for example, an insulator pattern, such as a gate insulating film, a semiconductor pattern, such as a polysilicon gate electrode, a metal pattern, such as an aluminum wiring line, or a resist pattern.

Next, as shown in FIG. 6C, the Si wafer 1 is heated by the flash lamp light source 5 and the hot plate 4 as in the first embodiment.

Figure 7:
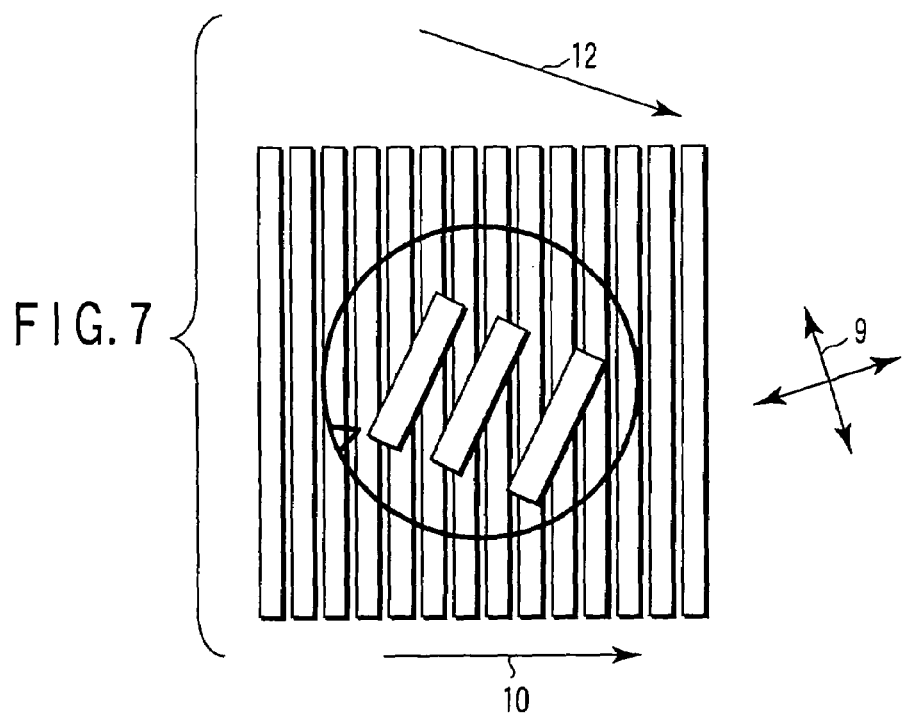
FIG. 7 is a plan view showing the relationship between the lamp arranging direction, the crystal orientation and the line pattern arranging direction in the heating process of the second embodiment.

FIG. 7 is a plan view showing the relationship between the lamp arranging direction 10, the crystal orientation 9 and the line pattern arranging direction 12 in the heating process. As seen from FIG. 7, in the second embodiment, the lamp arranging direction 10 is set so as to differ from the crystal orientation 9 and the line pattern arranging direction 12.

Since the optical absorption coefficient of the Si wafer 1 differs from that of the pattern lip, there is a temperature difference between the Si wafer 1 and the pattern 11p. As a result, thermal stress is applied to the pattern 11p.

However, it has become clear that, when the lamp arranging direction 10 differs from the crystal orientation 9 and the line pattern arranging direction 12, it is difficult for a temperature difference to appear.

Therefore, with the second embodiment, it is possible to prevent heat damage, such as slips or cracks, from occurring in the Si wafer 1 in heating the Si wafer including the pattern 11p.

Although the lamp arranging direction 10 and the line pattern arranging direction 12 may be the same, making them different from each other enables a much greater heat damage alleviation effect to be expected.

THIRD EMBODIMENT

FIGS. 8A to 8E are sectional views showing the steps of a manufacturing method of a MOS transistor according to the third embodiment of the present invention.

Figure 8A:
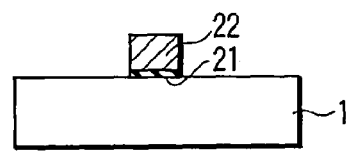
FIGS. 8A to 8E are sectional views showing the steps of a manufacturing method of a MOS transistor according to the third embodiment of the present invention.

First, as shown in FIG. 8A, a gate insulating film 21 and a gate electrode 22 are formed on a Si wafer 1 by a known method.

Figure 8B:
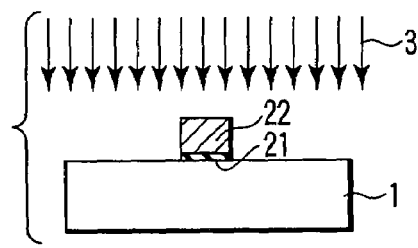

Next, as shown in FIG. 8B, with the gate electrode 22 as a mask, impurity ions 3 are implanted into the surface of the Si wafer 1.

Figure 8D:
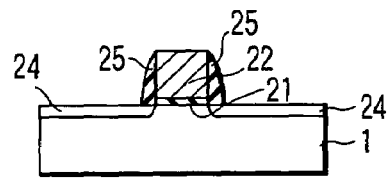
Figure 8C:
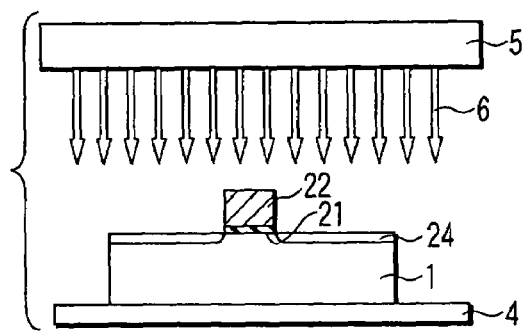

Next, as shown in FIG. 8C, the Si wafer 1 is heated as in the step of FIG. 1B in the first embodiment (a first heating process). As a result, the impurity ions 3 are activated, with the result that an extension region (a first impurity diffusion region) 24 is formed at the surface of the Si wafer 1 in a self-aligning manner.

At this time, since the lamp arranging direction 10 is set to a different direction from the crystal orientation 9 as in the first embodiment, heat damage, such as slips and cracks, does not occur in the Si wafer 1 and the process window becomes wider.

Next, as shown in FIG. 8D, a gate sidewall insulating film (spacer) 25 is formed by a known method. Thereafter, with the gate sidewall insulating film 25 and gate electrode 22 as a mask, impurity ions (not shown) are implanted into the surface of the wafer 1.

Figure 8E:
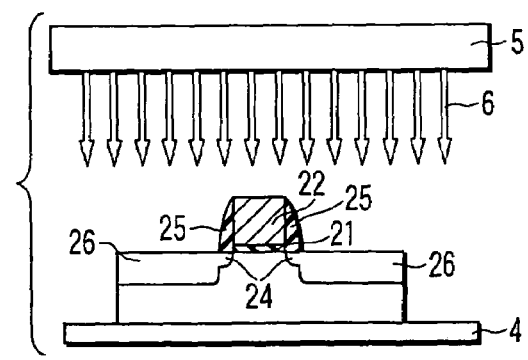

Next, as shown in FIG. 8E, the Si wafer 1 is heated as in the step of FIG. 1B in the first embodiment (a second heating process). As a result, the impurity ions are activated, with the result that a source/drain region (a second impurity diffusion region) 26 is formed on the surface of the Si wafer 1.

At this time, since the lamp arranging direction 10 is set to a different direction from the crystal orientation 9 as in the first embodiment, heat damage, such as slips and cracks, does not occur in the Si wafer 1 and the process window becomes wider.

Furthermore, in the first heating process, the Si wafer 1 or flash lamp light source 5 is rotated, thereby setting the lamp arranging direction 10 in the second heating process to a different direction from the arranging direction of the flash lamps 8 in the first heating process. As a result, the direction of the thermal stress produced in the Si wafer 1 by the irradiation of the flash lamp in the second heating process differs from the direction of the thermal stress produced in the Si wafer 1 by the irradiation of the flash lamp in the first heating process.

As a result, the load caused by the thermal stress accumulated in the Si wafer 1 is alleviated effectively. This makes it easy to increase resistance to heat damage, such as slips or cracks, in the Si wafer 1 even when two heating processes are carried out.

Even when three or more heating processes are carried out, the same effect can be produced by making the lamp arranging direction 10 in one heating process different from that in another heating process.

The lamp arranging direction 10 does not necessarily differ from one heating process to another. For example, when three or more heating processes are carried out, the lamp arranging direction 10 in the first heating process may be the same as that in the last heating process. The reason for this is that the first heating process is separate in time from the last heating process and therefore the effect of the accumulation of these heating processes is a little.

The method of carrying out a plurality of heating processes in the third embodiment is effective in the process (annealing process) of forming impurity diffusion regions other than the impurity diffusion regions (the extension region 24, source/drain region 26) of a MOS transistor. In addition, the method is also effective in a thermal process other than the impurity ion annealing process.

Moreover, when a plurality of MOS transistors are formed, it is desirable that the arranging direction of a plurality of gate electrodes 22 should be set to a direction different from the crystal orientation 9 and lamp arranging direction 10 (see the second embodiment).

FOURTH EMBODIMENT

Figures 9A, 9B:
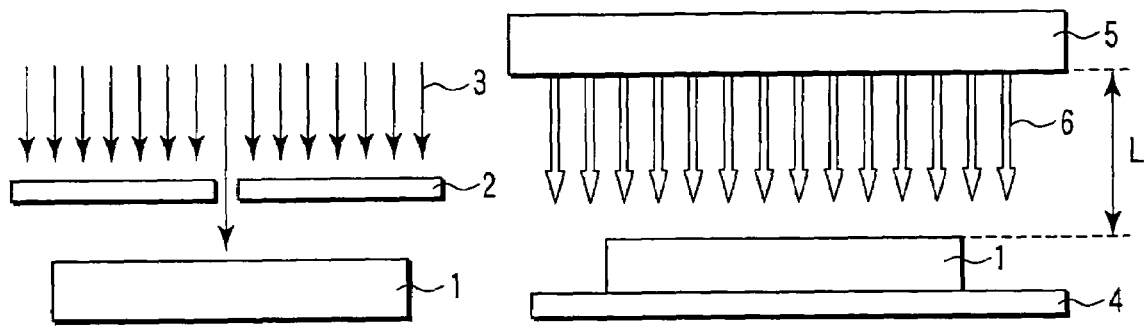
FIGS. 9A and 9B are sectional views showing the steps of a manufacturing method of a semiconductor device according to the fourth embodiment of the present invention.

FIGS. 9A and 9B are sectional views showing the steps of a manufacturing method of a semiconductor device according to the fourth embodiment of the present invention.

As shown in FIG. 9A, the mask 2 for ion implantation is positioned above the Si wafer 1. An ion implanter (not shown) implants impurity ions 3 into the Si wafer 1 from above the mask 2.

Next, as shown in FIG. 9B, the Si wafer 1 is put on the hot plate 4. With the Si wafer 1 being heated from its reverse side, the Si wafer 1 is heated from its right side by light 6 emitted from the flash lamp light source 5. By the heating process, the impurity ions 3 are activated, thereby forming an impurity diffusion region.

The distance (irradiation distance) L between the Si wafer 1 and the flash lamp light source 5 is set in the range of 23 to 46 mm. The energy of the light emitted from each of a plurality of flash lamps constructing the flash lamp light source 5 is basically the same.

The reason why the irradiation distance L is set so as to fulfill the expression 23 mm$\leq$=L$\leq$46 mm is as follows.

Figure 10:
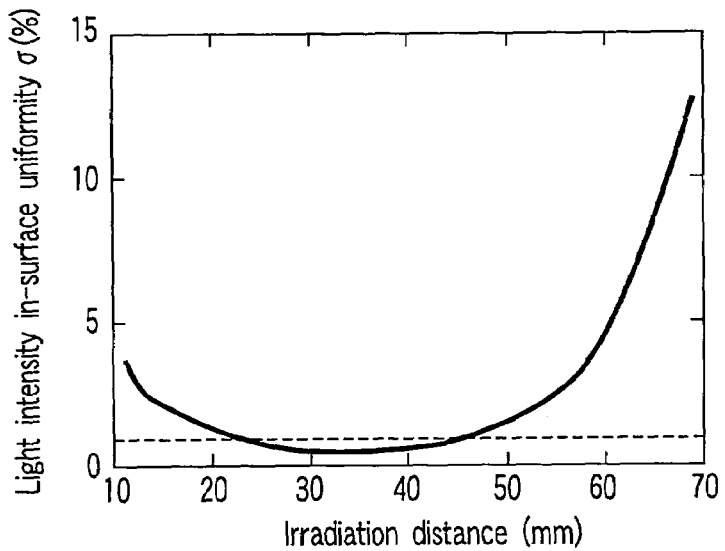
FIG. 10 is a diagram showing the relationship between the uniformity of light intensity and the irradiation distance L on the surface of the Si wafer of the fourth embodiment.
Figure 11:
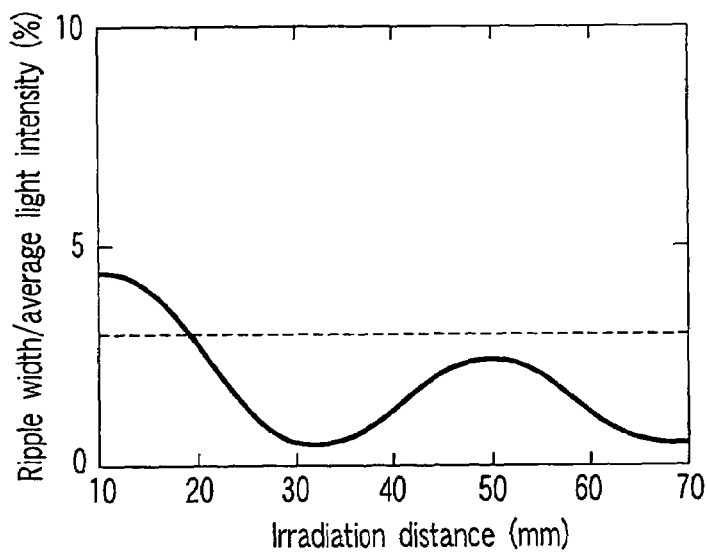
FIG. 11 is a diagram showing the relationship between the ripple width/average light intensity and the irradiation distance of the fourth embodiment.

FIG. 10 is a diagram showing the relationship between the uniformity a of the intensity of light 6 on the surface of the Si wafer and the irradiation distance L. FIG. 11 is a diagram showing the relationship between the ripple width/average light intensity and the irradiation distance L. The ripple width is the difference (D1–D2) between the light intensity D1 on the surface of the Si wafer just under the flash lamp and the light intensify D2 on the surface of the Si wafer 1 just under the place between two adjacent flash lamps. The average light intensity is the average intensity of light 6 on the surface of the Si wafer 1. FIGS. 10 and 11 show the results obtained when the size of the Si wafer 1 is 8 inches. Similar results were also obtained in other sizes.

From FIG. 10, it has become clear that the value of the light intensity in-surface uniformity a increases as the irradiation distance L becomes shorter than 23 mm, or as the irradiation distance L becomes longer than 46 mm. In addition, from FIG. 10, it is found that, when the irradiation distance L meets the expression 23 mm$\leq$L$\leq$46 mm, the value of the light intensity in-surface uniformity a is 1% or less. The value $\sigma$=1% or less is sufficient in terms of specification.

From FIG. 11, it is seen that the ripple width/average light intensity has a sufficiently low value before and after the irradiation distance L=30 mm and L=69 mm. However, before and after the irradiation distance L=69 mm, the value of the light intensity in-surface uniformity a is large as shown in FIG. 10.

Therefore, the irradiation distance L is set in the range of 23 mm or more and 46 mm or less, thereby reducing the dependence of the light intensity in-surface uniformity a on the irradiation distance and that of the ripple width/average light intensity on the irradiation distance at the same time. As a result, the effect of thermal stresses attributable to the light intensity in-surface uniformity a and ripple width/average light intensity becomes sufficiently little, which improves the resistance of the Si wafer to heat damage, such as slips and cracks.

Furthermore, an examination of the average yield of a logic circuit comprising MOSFETs using the impurity diffusion region 7 of the fourth embodiment in their source/drain region has shown that 97% was achieved by setting the irradiation distance L in the range of 23 mm or more and 46 mm or less.

In addition to the above method, there are methods of providing a light diffusing plate or a light intensity filter between the Si wafer 1 and the flash lamp light source 5 to reduce the dependence of the light intensity in-surface uniformity a on the irradiation distance and that of the ripple width/average light intensity on the irradiation distance at the same time. However, these methods have the following problems.

The energy of the light 6 emitted from the flash lamp light source 5 is attenuated by the light diffusing plate or light intensity filter until it has reached the Si wafer 1. Therefore, it is necessary to supply to the flash lamp light source 5 an electric power (voltage) higher than that in the fourth embodiment by the amount of energy attenuated by the light diffusing plate or light intensity filter. This will degrade the withstand voltage of the flash lamps constructing the flash lamp light source 5 and shorten the service life of the flash lamp light source 5.

In contrast, with the fourth embodiment, since the energy of the light 6 hardly attenuates, the Si wafer can be heated efficiently. As a result, it is not necessary to apply a high electric power (high voltage) to the flash lamp light source 5 and therefore prevent the service life of the flash lamp light source 5 from being shortened.

The method of the fourth embodiment may be combined with the method of the second embodiment or the method of the third embodiment.

While in the first to fourth embodiments, the flash lamp has been used as the light source for heating, another lamp, such as a halogen lamp can be used. In addition, a light source other than a lamp, such as a laser can be used.

For instance, when a laser that emits a line beam is used, what has been explained in the first to fourth embodiments can be practiced by reading the lamp arrange direction in the first to fourth embodiments as the longitudinal direction of the laser beam. In this case, too, similar effects to those of the first to fourth embodiments are obtained.

FIFTH EMBODIMENT

A method of manufacturing a semiconductor device according to a fifth embodiment of the present invention differs from a conventional one in that the ½ pulse width of the flash lamp light source 5 is set in a predetermined value (1 millisecond) or less.

First, as shown in FIG. 1A, the mask 2 for ion implantation is positioned above the Si wafer 1 and then impurity ions 3 are implanted into the Si wafer 1 from above the mask 2 with the ion implanter (not shown).

Next, as shown in FIG. 1B, the Si wafer 1 is placed on the hot plate 4. With the Si wafer 1 being heated from the reverse side, the Si wafer 1 is heated from its right side by light 6 emitted from the flash lamp light source 5.

The heating temperature of the Si wafer 1 with the hot plate 4 is set to 500° C. In place of the hot plate 4, another heating device, such as a halogen lamp, one of the infrared lamps, may be used. Alternatively, the heating temperature of the Si wafer may be other than 500° C.

The energy of the light 6 emitted from the flash lamp light source 5 is, for example, 20 to 40 J/cm$^2$. The ½ pulse width of the flash lamp light source 5 is set in 1 millisecond or less.

The flash lamp light source 5 of the fifth embodiment has been developed independently for research. The flash lamp light source 5 can set a ½ pulse width as short as 1 millisecond or less, which was impossible with a conventional flash lamp light source. To shorten the ½ pulse width, the capacity of the condenser connected to the circuit of the flash lamp light source is made smaller. For example, connecting a condenser of several hundred μF in parallel with the flash lamp enables a ½ pulse width of 1 millisecond or less to be achieved. Actually, 0.7 ms was achieved with 400 μF.

Figure 12:
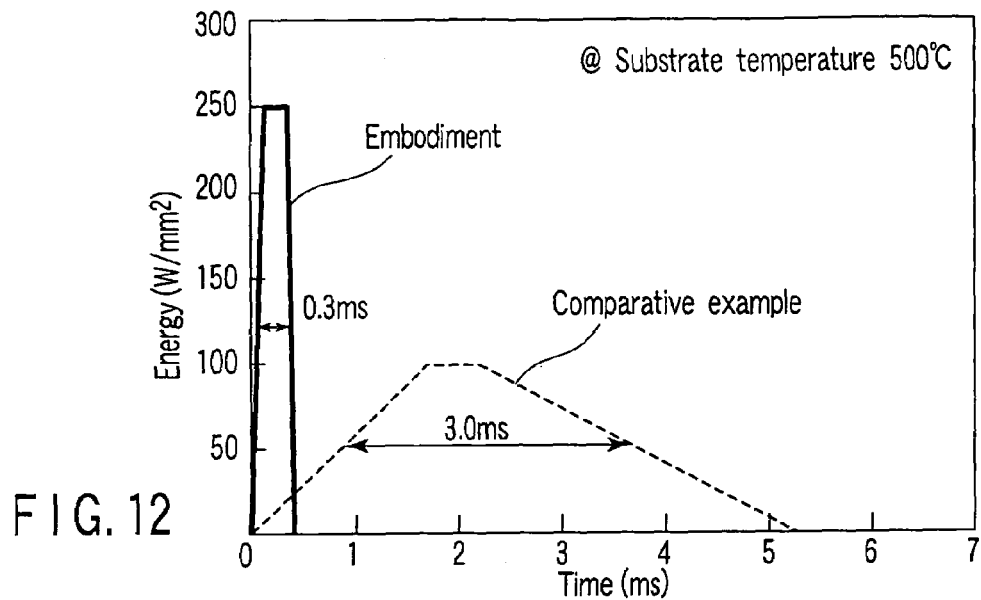
FIG. 12 is a diagram of a light emitting waveform of the flash lamp in each of the fourth embodiment and a comparative example.

FIG. 12 shows a light-emitting waveform of the light 6 emitted from the flash lamp light source 5 of the fifth embodiment. In the fifth embodiment, as shown in FIG. 12, the ½ pulse width is set in 0.3 millisecond. FIG. 12 also shows a comparative example of a light-emitting waveform with a ½ pulse width of 3.0 milliseconds.

By the heating process, the impurity ions 3 are activated, with the result that a shallow impurity diffusion region 7 is formed to a thickness of 20 nm or less on the surface of the Si wafer as shown in FIG. 1C.

Figure 13:
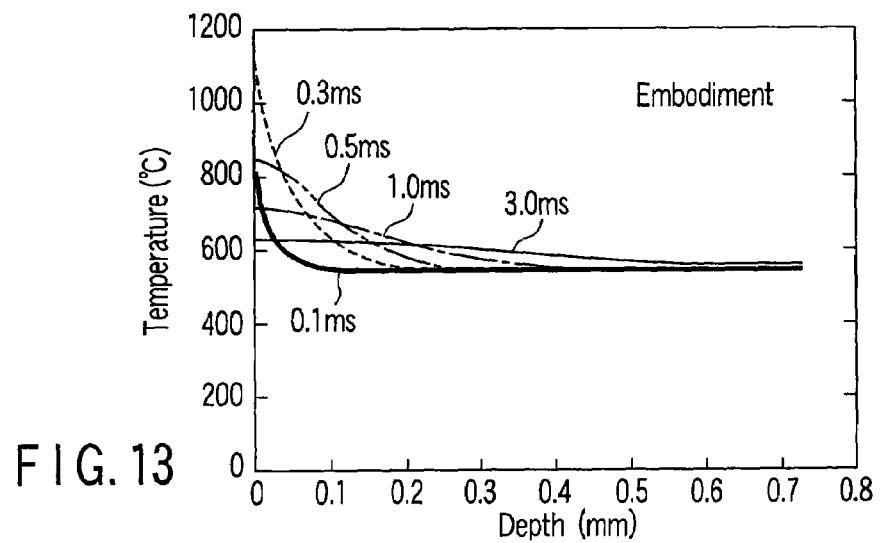
FIG. 13 is a diagram of a temperature distribution in the direction of the thickness of the Si wafer at each time after the irradiation of the flash lamp of the fourth embodiment.
Figure 14:
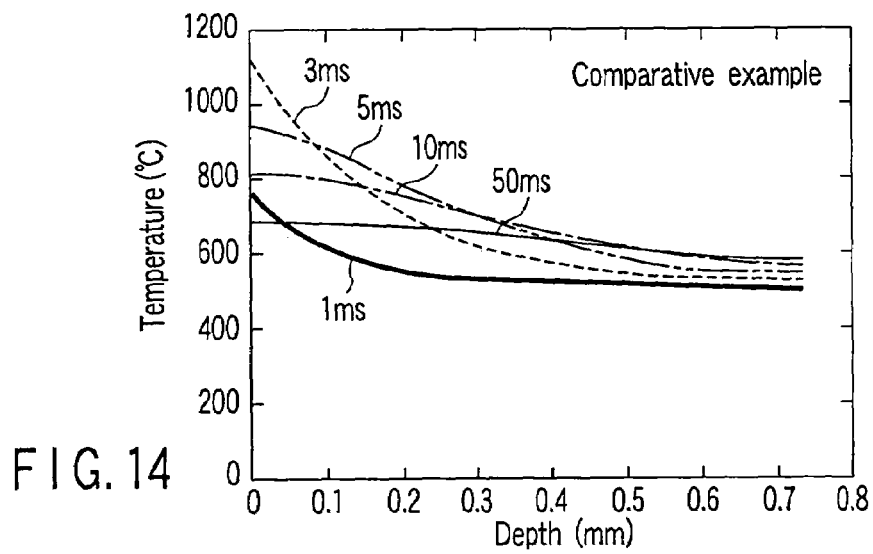
FIG. 14 is a diagram of a temperature distribution in the direction of the thickness of the Si wafer at each time after the irradiation of the flash lamp of a comparative example.

FIGS. 13 and 14 are diagrams of a temperature distribution in the direction of the thickness of the Si wafer 1 at each time after the irradiation of the flash lamp in the fifth embodiment (½ pulse width=0.3 millisecond) and in a comparative example (½ pulse width=3 milliseconds), respectively.

In the fifth embodiment, after the irradiation of the flash lamp, the right side temperature of the Si wafer 1 rises sharply and reaches up to 1100° C. about 0.3 millisecond later. At this time, the reverse side temperature of the Si wafer 1 is governed by the substrate preheating temperature with the hot plate 4. As a result, a temperature difference of about 600° C. appears between the right side and back side of the Si wafer 1.

On the other hand, in the comparative example, after the irradiation of the flash lamp, the right side temperature of the Si wafer 1 reaches up to 110° C. about 3 milliseconds later. The ½ pulse width in the comparative example is greater than that in the fifth embodiment. Therefore, the temperature distribution in the direction of the wafer thickness in the comparative example is gentler than that in the fifth embodiment.

Figure 15A:
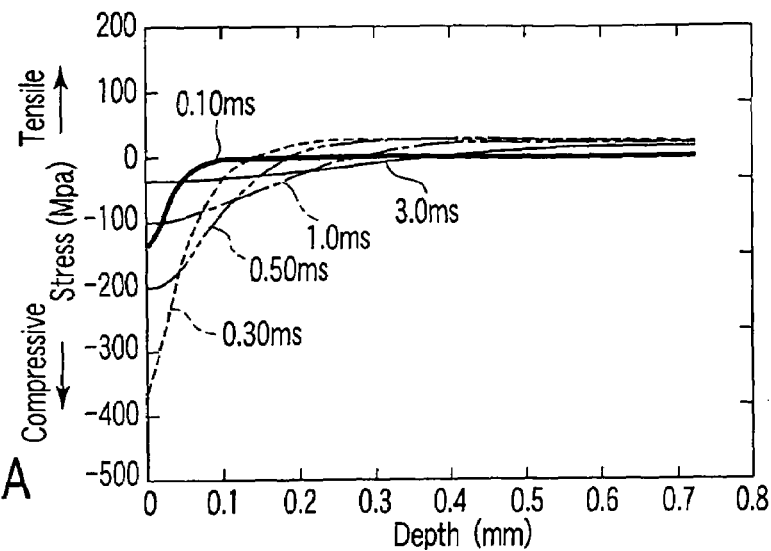
FIGS. 15A and 15B are diagrams to explain stresses occurring in the direction of the thickness of the Si wafer at each time after the irradiation of the flash lamp of the fourth embodiment.
Figure 15B:
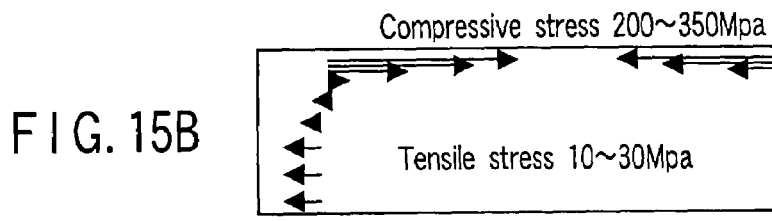

FIGS. 15A and 15B and FIGS. 16A and 16B are diagrams to help explain stresses occurring in the direction of the thickness of the Si wafer 1 at each time after the irradiation of the flash lamp in the fifth embodiment and in a comparative example, respectively. FIG. 15A schematically shows a distribution of the stress when the surface of the Si wafer has a depth of 0 mm. FIG. 15B schematically shows the stress at the cross section of the Si wafer. The substrate preheating temperature in the fifth embodiment and that in the comparative example are both at 500° C.

Figure 16A:
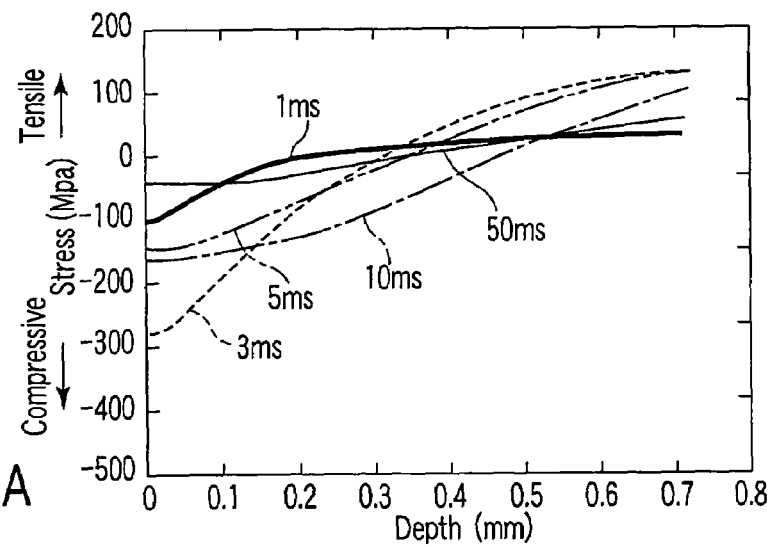
FIGS. 16A and 16B are diagrams to help explain stresses occurring in the direction of the thickness of the Si wafer at each time after the irradiation of the flash lamp in a comparative example.

In each of FIGS. 15A and 16A, the area determined by the waveform representing the tensile stress and the straight line of stress=0 is the same as the area determined by the waveform representing the compressive stress and the straight line, regardless of the elapsed time since the irradiation time.

In each of the fifth embodiment and the comparative example, after the irradiation of the flash lamp, stress grows within the Si waver 1. The stress grows as compressive stress at the surface of the Si wafer 1 and as tensile stress in the part from the inside of the Si wafer 1 to its reverse side.

Then, in the fifth embodiment, the stress occurring about 0.3 to 0.5 millisecond after the irradiation of the flash lamp becomes the largest. The largest tensile stress value is about 40 MPa. On the other hand, in the comparative example, the stress occurring about 3 to 5 milliseconds after the irradiation of the flash lamp becomes the largest.

The depth at which the compressive stress changes to the tensile stress in the comparative example is greater than that in the fifth embodiment. In other words, a balance between the compressive stress and the tensile stress is kept at a region closer to the reverse side of the Si wafer 1 in the comparative example than in the fifth embodiment. Therefore, although the fifth embodiment has a larger difference between the right side temperature and reverse side temperature of the Si wafer than the comparative example, the absolute value of the tensile stress in the comparative example is larger than that in the fifth embodiment. In the comparative example, the tensile stress grows up to about 120 MPa.

Figure 17:
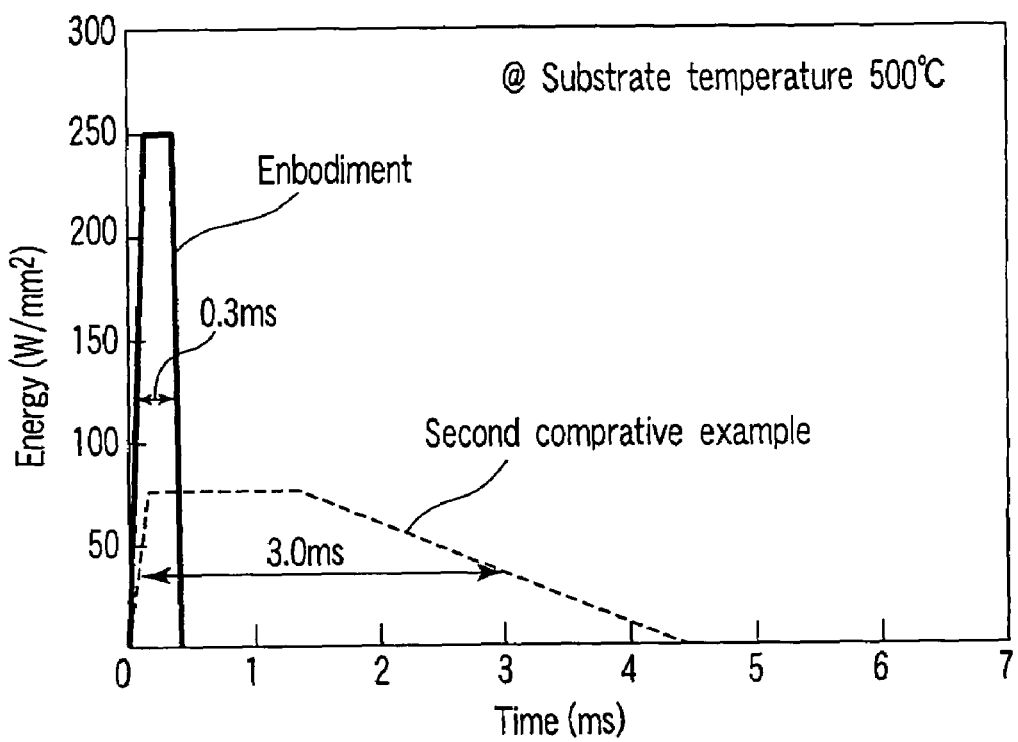
FIG. 17 is a diagram of light emitting waveforms in another comparative example (a second comparative example)

FIG. 17 is a diagram of light emitting waveforms in another comparative example (a second comparative example). The second comparative example has a shorter rise time of light emitting pulses than that in the comparative example (the first comparative example) of FIG. 12 and has a ½ pulse width of 3 milliseconds, the same as that of the comparative example.

An examination of the stress distribution and the maximum amount of stress in the second comparative example has shown a similar result to that in the first comparative example. From the result, it has become clear that the ½ pulse width has to be shortened to move the depth at which tensile stress occurs to the surface of the wafer.

Figure 18:
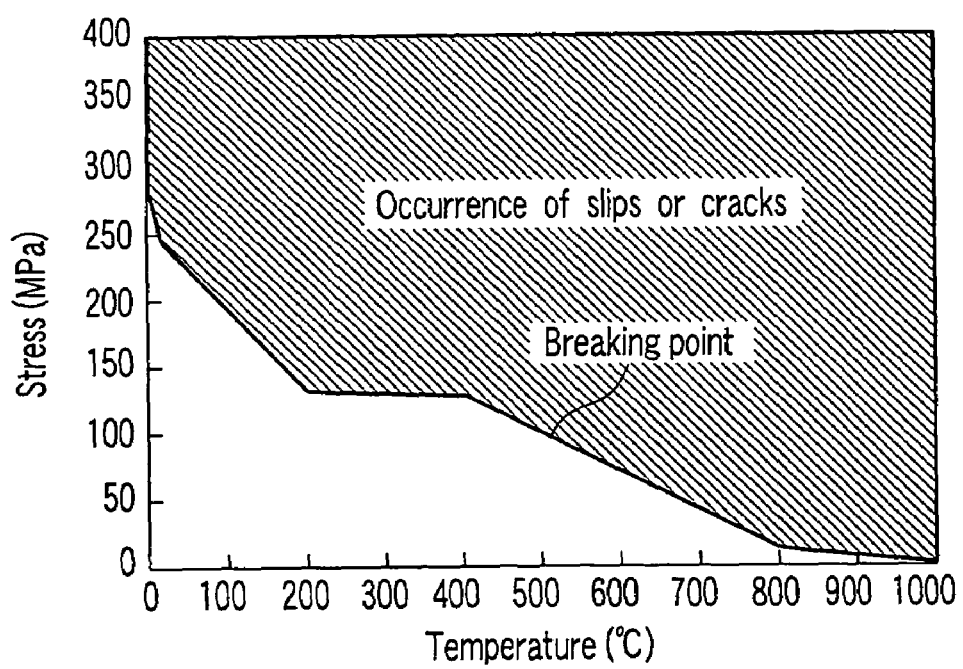
FIG. 18 is a diagram of a brittle fracture curve of a Si wafer.

FIG. 18 is a diagram of a brittle fracture curve of a Si wafer. From FIG. 18, it is seen that the strength to the tensile stress of the Si wafer decreases as the heating temperature of the Si wafer becomes higher.

Figure 16B:
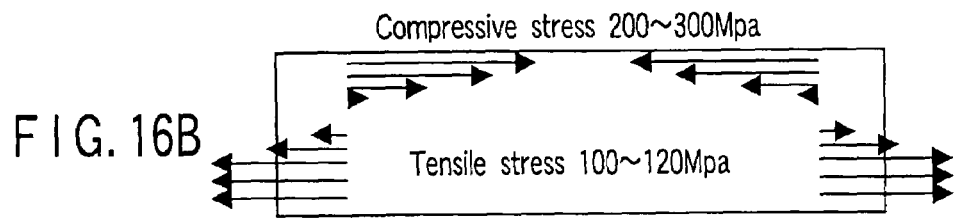

Furthermore, it is seen that the maximum tensile stress value at which the Si wafer does not fracture (slip or crack) at 500° C., the substrate preheating temperature in FIGS. 15A and 15B (of the fifth embodiment) and in FIGS. 16A and 16B (of the comparative example) is about 100 MPa. Since the tensile stress in the fifth embodiment is 10 to 30 MPa and the tensile stress in the comparative example is 100 to 120 MPa, the Si wafer is less liable to fracture in the fifth embodiment than in the comparative example. That is, the fifth embodiment has a wider process window than that of the comparative example.

Figure 19:
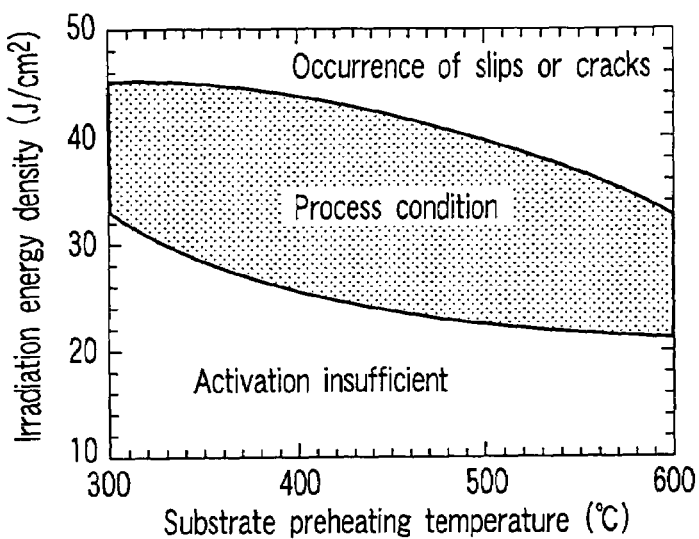
FIG. 19 is a diagram of a process window of the fifth embodiment regarding the substrate preheating temperature and the irradiation energy density.
Figure 20:
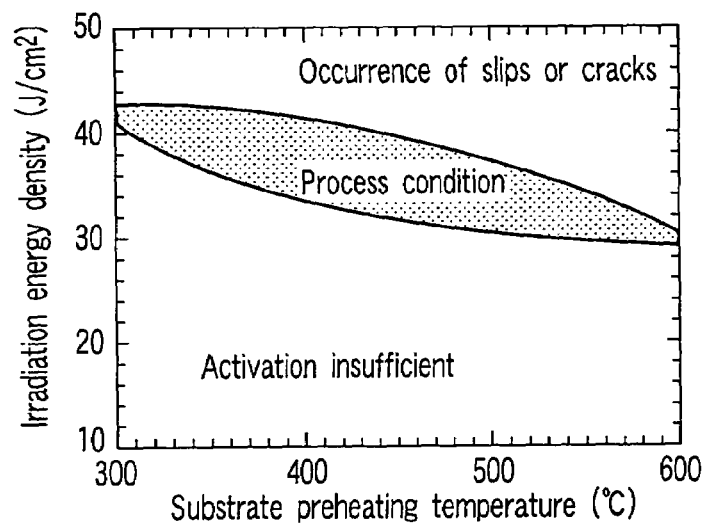
FIG. 20 is a diagram of a process window of a comparative example regarding the substrate preheating temperature and the irradiation energy density.

FIGS. 19 and 20 are diagrams of process windows of the fifth embodiment and a comparative example regarding the substrate preheating temperature and the irradiation energy density.

The higher the substrate preheating temperature, the lower the irradiation energy density necessary to activate impurities becomes. At the same time, the irradiation energy density at which slips or cracks occur in the Si wafer becomes lower.

When the irradiation energy density at which slips or cracks occur in the Si wafer in the fifth embodiment is compared with that in the comparative example, it is seen from FIGS. 19 and 20 that the irradiation energy density in the fifth embodiment is higher at any substrate preheating temperature. Therefore, it is conceivable that, the lower the substrate preheating temperature and the shorter the ½ pulse width, the wider the process window becomes.

As described above, with the fifth embodiment, the tensile stress value can be made smaller by shortening the ½ pulse width of the flash lamp light source 5. This improves the resistance of the Si wafer 1 to thermal stress. Therefore, the impurity ions implanted into the Si wafer 1 can be activated without permitting heat damage, such as slips or cracks, to occur in the Si wafer 1. That is, with the fifth embodiment, it is possible to realize the process of forming an impurity diffusion region with a wider process window.

Figure 21:
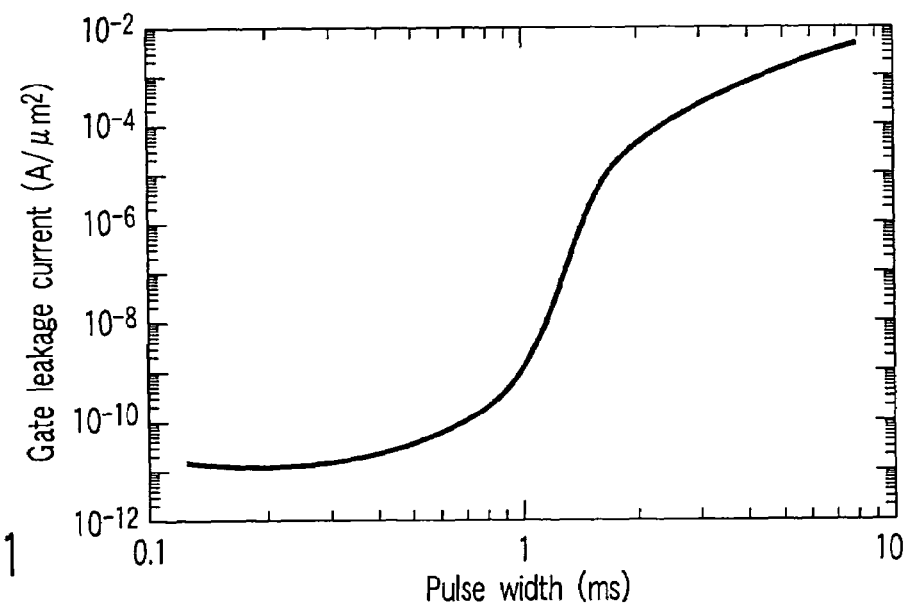
FIG. 21 is a diagram showing the relationship between gate leakage current of a MOS capacitor comprising an impurity diffusion region of the seventh embodiment and the pulse width.

FIG. 21 is a diagram showing the relationship between the gate leakage current of a MOSFET which uses the impurity diffusion region 7 as the source/drain region and the ½ pulse width. In FIG. 21, for simplification sake, the abscissa axis is marked with the pulse width, not the ½ pulse width (the same holds true for the other similar diagrams). From FIG. 21, it is seen that, when the ½ pulse width becomes 1 millisecond or less, the gate leakage current decreases sharply (below the specification) and that, when the ½ pulse width becomes 0.5 millisecond or less, the gate leakage current becomes stable at almost a small constant value. A similar result was also obtained with a MOS capacitor using the impurity diffusion region 7 of the fifth embodiment.

FIG. 22 is a diagram showing the relationship between the junction leakage current of a p-n junction comprising the impurity diffusion region 7 and the ½ pulse width. From FIG. 22, it is seen that, when the ½ pulse width becomes 1 millisecond or less, the junction leakage current decreases sharply (below the specification) and that, when the ½ pulse width becomes 0.5 millisecond or less, the junction leakage current becomes stable at almost a small constant value.

FIG. 23 is a diagram showing the relationship between the yield of a logic circuit comprising a plurality of the MOSFETs and the ½ pulse width. From FIG. 23, it is seen that, when the ½ pulse width becomes 1 millisecond or less, the yield increases sharply and that, when the ½ pulse width becomes 0.5 millisecond or less, the yield becomes stable at almost a large constant value.

From the above results, it is seen that the characteristics and yield of the element can be improved by setting the ½ pulse width in 1 millisecond or less, more preferably 0.5 millisecond or less. Conceivably, the reason for this is that setting the ½ pulse width in 1 millisecond or less causes the tensile stress value leading to heat damage to decrease sufficiently.

The present invention is not limited to the above embodiments. For instance, an embodiment obtained by combined the above embodiments suitably is possible. For example, embodiments obtained by applying the fifth embodiment to the first to fourth embodiments are possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

positioning a light source above a substrate including a single crystal semiconductor region; and heating the substrate by use of light emitted from a light source and forming a light intensity distribution on the substrate by use of the light, the light intensity distribution including a distribution whose intensity has a maximum value in a direction different from a crystal orientation of the single crystal semiconductor region.

2. The method of manufacturing a semiconductor device according to claim 1, wherein the light source includes a plurality of lamps and is positioned above the substrate in such a manner that an arranging direction of the plurality of lamps differs from the crystal orientation of the single crystal semiconductor region.

3. The method of manufacturing a semiconductor device according to claim 1, wherein the light source includes a plurality of lamps and is positioned above the substrate in such a manner that a longitudinal direction of the plurality of lamps differs from the crystal orientation of the single crystal semiconductor region.

4. The method of manufacturing a semiconductor device according to claim 1, wherein the light source includes a flash lamp or a halogen lamp.

5. The method of manufacturing a semiconductor device according to claim 1, wherein the light source includes a laser which irradiates a line beam and is positioned above the substrate in such a manner that a longitudinal direction of the beam differs from the crystal orientation of the single crystal semiconductor region.

6. The method of manufacturing a semiconductor device according to claim 1, wherein the heating the substrate by use of light emitted from the light source is carried out a plurality of times, and the arranging direction of the plurality of lamps is changed each time the heating the substrate is carried out.

7. The method of manufacturing a semiconductor device according to claim 1, further comprising: setting a distance between the substrate and the light source in a range of 23 mm or more and 46 mm or less.

8. The method of manufacturing a semiconductor device according to claim 1, further comprising: preheating the substrate and, heating the substrate by use of light emitted from the light source during the preheating the substrate.

9. The method of manufacturing a semiconductor device according to claim 1, wherein the crystal orientation of the single crystal semiconductor region is a surface orientation of a cleavage plane of the semiconductor region.

10. The method of manufacturing a semiconductor device according to claim 1, further comprising: setting a ½ pulse width of the light source in 1 millisecond or less.

11. The method of manufacturing a semiconductor device according to claim 1, wherein the substrate further includes a pattern formed on the single crystal semiconductor region.

12. The method of manufacturing a semiconductor device according to claim 11, wherein the pattern includes a line pattern, a longitudinal direction of the line pattern differing from the crystal orientation of the single crystal semiconductor device.

13. A method of manufacturing a semiconductor device comprising:

positioning a light source above a substrate including a single crystal semiconductor region; and heating the substrate by use of light emitted from a light source, and a ½ pulse width of the light source being set in 1 millisecond or less.

14. The method of manufacturing a semiconductor device according to claim 13, wherein the light source includes a flash lamp or a laser.

15. The method of manufacturing a semiconductor device according to claim 13, wherein the ½ pulse width of the light source is set in 0.5 millisecond or less.

16. The method of manufacturing a semiconductor device according to claim 13, wherein the substrate further includes an impurity diffusion region formed on a surface of the single crystal semiconductor region.

17. The method of manufacturing a semiconductor device according to claim 16, wherein the impurity diffusion region has a depth of 20 nm or less.

18. The method of manufacturing a semiconductor device according to claim 13, wherein the substrate further includes a pattern formed on the single crystal semiconductor region.

* * * * *